United States Patent [19]

Jung et al.

[11] Patent Number: 5,592,479
[45] Date of Patent: Jan. 7, 1997

[54] TIME SWITCHING DEVICE HAVING IDENTICAL FRAME DELAY AND A METHOD THEREOF IN A FULL-ELECTRONIC EXCHANGE

[75] Inventors: Jung S. Jung; Bae H. Kim, both of Kyoungki-do, Rep. of Korea

[73] Assignee: Hyundai Electronics Industries Co., Ltd., Kyoungki-do, Rep. of Korea

[21] Appl. No.: 454,864

[22] Filed: May 31, 1995

[30] Foreign Application Priority Data

Jun. 30, 1994 [KR] Rep. of Korea ............... 94-15657

[51] Int. Cl.⁶ ........................................... H04Q 11/08
[52] U.S. Cl. ................................. 370/378; 370/517
[58] Field of Search ....................... 370/62, 66, 108, 370/68, 58.1, 100.1, 61; 327/261, 263, 269, 273, 276, 279

[56] References Cited

U.S. PATENT DOCUMENTS 3,967,070  6/1976  Srivastava et al. .................. 370/66
4,941,141  7/1990  Hayano .............................. 370/58.1
4,995,034  2/1991  Lubcke et al. ..................... 370/95.1

*Primary Examiner*—Douglas W. Olms
*Assistant Examiner*—Ajit Patel
*Attorney, Agent, or Firm*—Wigman, Cohen, Leitner & Myers, P.C.

[57] ABSTRACT

A time switching device and method having identical frame delay in a full-electronic exchange allows respective channels to have identical frame delay after switching multichannel in the full-electronic exchange by using only one time memory within the time switching device for providing data service of channel capacity larger than 64[Kbps], in which a time memory having a capacity four times larger than time switch capacity is divided into four areas to maintain a difference between the memory write and read operations by at least one frame period (125 μs), thereby simplifying the structure of the time switching device and occupying a small area of a printed circuit board to accomplish small-sized system while decreasing the number of components required for constructing the system, thereby reducing system construction cost.

2 Claims, 2 Drawing Sheets

TIME SWITCHING DEVICE HAVING IDENTICAL FRAME DELAY AND A METHOD THEREOF IN A FULL-ELECTRONIC EXCHANGE

BACKGROUND OF THE INVENTION

1. Field of the Invention

The present invention relates to a time switching device having identical frame delay in a full-electronic exchange and method therefor, and more particularly to a time switching device having identical frame delay in a full-electronic exchange and method therefor, wherein only a single time memory within the time switching device is utilized for switching multichannel in the full-electronic exchange to allow respective channels to have identical frame delay, thereby providing data service of the channel capacity larger than 64[Kbps].

2. Description of the Prior Art

In order to make respective channels have identical frame delay in a time switch after switching the multichannel, a time memory having a capacity twice the time switch capacity is generally utilized to divide the time memory into two address areas, and access is carried out alternatively to the two address areas by one frame period (i.e., 125 μs) during performance of a memory write and read operations.

However, the memory write and read operations performed by means of the time having a capacity twice the time switch capacity can be accomplished only when the frame pulse position of the input side is identical to that of the output side of the time memory. If the time switch includes a multiplexer and a backward multiplexer, data becomes multiplexed while the pulse position of a frame, i.e., a starting point of a time slot, is determined to be supplied to the time memory. Therefore, the output positions differ in response to a random read address, so that the identical frame delay of respective channels cannot be secured after switching the multichannel.

Accordingly, in order to solve this problem, a conventional time switch is separately attached to a time memory for adjusting the frame position to permit the frame pulse positions of the input side and output side of the time memory to be identical to each other, thereby making it possible to provide the multichannel service. In this case, however, system structure is complicated due to addition of the separate time memory, causing inconvenience in constructing the system.

In connection with the time switch, a technique described in U.S. Pat. No. 4,995,034 is known to the person of ordinary skill in the art, in which the construction of a telecommunication system is simplified and, simultaneously, a specific portion can be expanded without additionally installing a switch. More specifically, in a telecommunication system including a plurality of user terminals, a module for providing at least one accessory function, and a central switch for providing time division multiplex communication between the above two devices, at least one fixed time slot is assigned to establish mutual communication of the user terminals, and the assigned time slot is utilized to execute mutual access. Successively, the assigned time slot is divided into a plurality of telecommunication channels, and a part of the plurality of telecommunication channels is selected to establish the mutual communication in the module that provides the accessory function.

Consequently, the above technique is contrived to solve a problem of additionally installing the separate switch, which results from employing the accessory-function providing module that requires the plurality of channels, thereby reducing the burdensome cost. However, a single memory is used as the time memory portion within the time switch of the switch to carry out the inherent function, which cannot be applied to a technique for simplifying the system structure.

SUMMARY OF THE INVENTION

The present invention is devised to solve the above-described problems. Accordingly, it is an object of the present invention to provide a time switching device having identical delay in a full-electronic exchange and method therefor, wherein a time memory having a capacity four times larger than time switch capacity is employed to be divided into four areas, and access to the four areas is sequentially performed during the memory write and read operations while maintaining the memory write and read operations different from each other by at least one frame period (i.e., 125 μs), thereby allowing respective channels to have the identical frame delay after switching the multichannel.

To achieve the above object of the present invention, there is provided a time switching device having identical frame delay used in a full-electronic exchange and having an area division address generator for providing a difference between memory write time and memory read time of at least one frame period. The area division address generator includes a time memory for storing multiplexed data from a multiplexer, a 2-bit counter for counting reference pulses to sequentially generate successive addresses, a first flip-flop for receiving a random read frame pulse signal to delay a signal from the 2-bit counter for at least one frame and then output the result, and a second flip-flop for receiving a switching clock to clock a signal from the first flip-flop with the signal from the 2-bit counter to output the result.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENT

Figure 1:
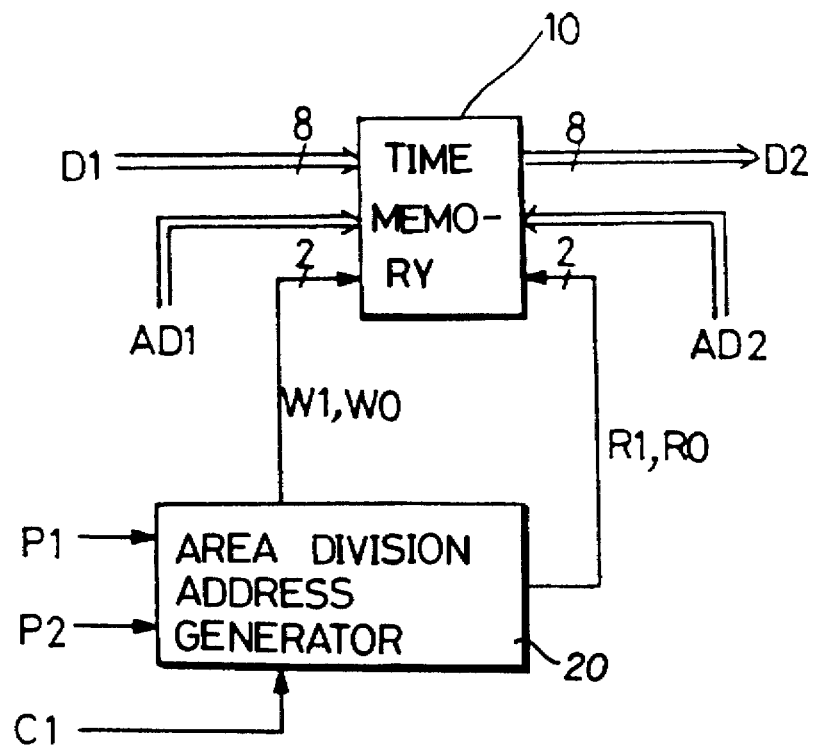
FIG. 1 is a block diagram showing a time switch according to the present invention.
Figure 3:
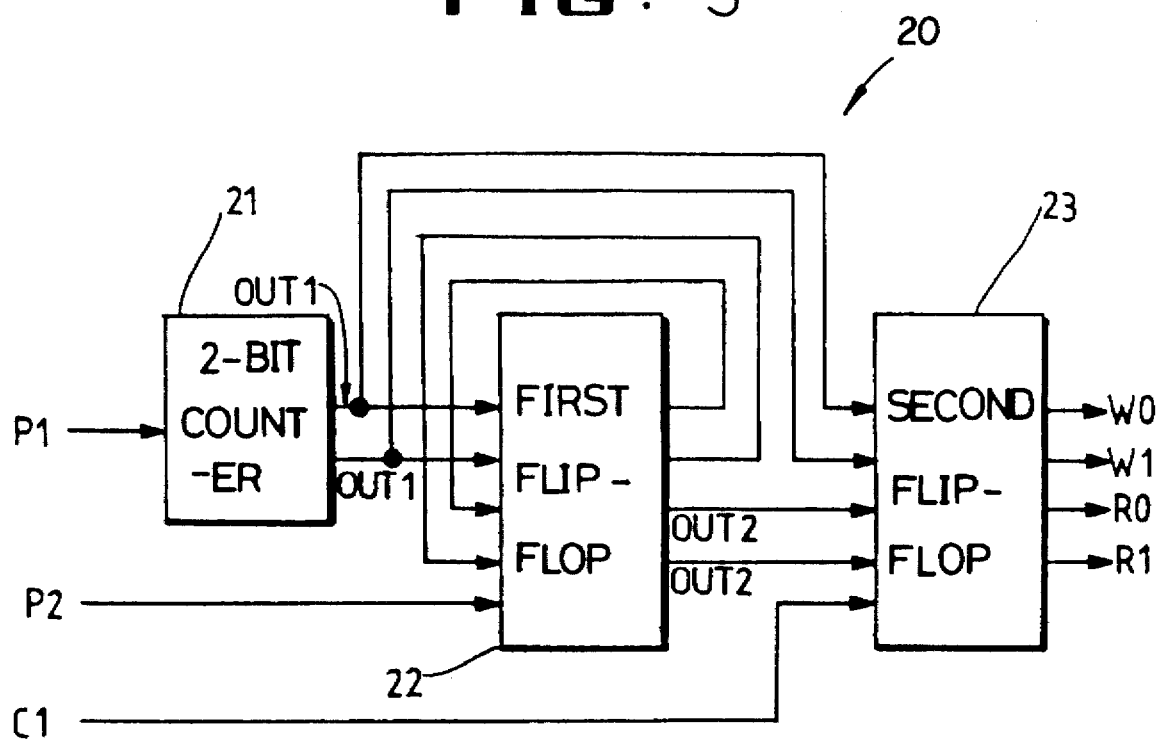
FIG. 3 is a detailed circuit diagram showing the area division address generator.

As shown in FIG. 1, a time switching device according to the present invention includes a time memory 10 for storing multiplexed data received from a multiplexer, and an area division address generator 20 for inducing a difference between the memory write time and read time of at least one frame period. The area division address generator 20, as shown in FIG. 3, has a 2-bit counter 21 for counting reference pulses to sequentially generate continuous addresses, a first flip-flop 22 which receives a random read frame pulse signal P2, and delays a signal OUT1 from the 2-bit counter 21 for at least one frame so as to output the delayed signal, and a second flip-flop 23 for receiving a switching clock C1 to clock a signal OUT2 from the first flip-flop 22 with the signal OUT1 from the 2-bit counter 21.

The operation of the time switching device constructed as above will be briefly described.

The multiplexed data generally received from a multiplexer of a time switch is sequentially stored in the time memory by sequential addresses from an internal counter, i.e., the sequential write of the multiplexed data is executed.

The data stored in the time memory as described above is randomly-read by a random address from an internal control memory to switch a time slot, and the switch of the time slot is repeated in the unit of 8[KHz].

The above-stated operation will be described in detail with reference to the block diagram and timing charts of FIGS. 1 to 4.

Figure 2:
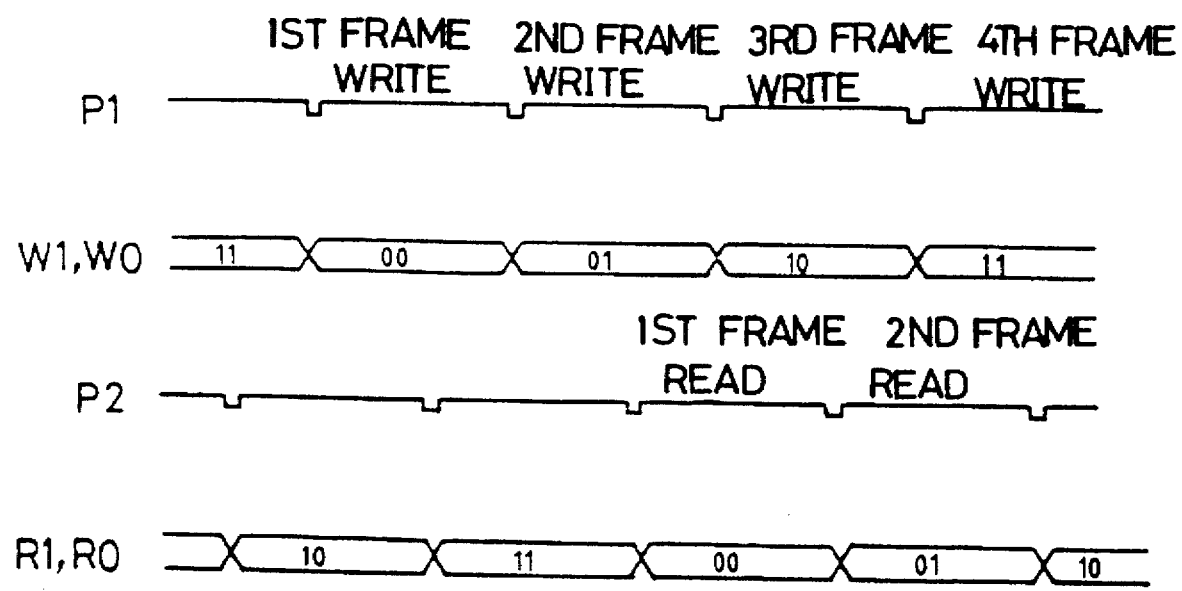
FIG. 2 shows operational timing charts according to the present invention.

To begin with, 8-bit multiplexed data D1 from a multiplexer (not shown) is sequentially written on the time memory 10 as shown in FIG. 1 in such a manner that, as can be noted from the operational timing chart with respect to the time memory divided into four address areas as shown in FIG. 2, frame data primarily received in accordance with 2-bit area division write addresses W1 and W2 generated by counting sequential write frame pulses P1 and a sequential write address AD1 from a 10-bit counter (not shown) representing an actual address are written on the first address area, the secondarily received frame data is written on the second address area, thirdly received frame data are written on the third address area, and then, the succeeding frame data are continuously written in the same way as described above.

Here, when considering address areas for sequentially-writing the data on them, the area division write addresses W1 and W0 shown in FIG. 2 are repeatedly augmented in the order of 00, 01, 10, 11, 00, 01, 10, . . . by 2 bits.

The data sequentially written on the time memory 10 as described above are applied to an address terminal on the output side of the time memory 10 by a 10-bit random read address AD2 representing an actual address received from a control memory (not shown) and area division read addresses R1 and R0 to be read out. At this time, since the area division read addresses R1 and R0 are later than the area division write addresses W1 and W0 by at least one frame, all channels after switching the multichannel are consequently delayed by approximately 2 frames when including the delay caused during the multiplexing.

As can be noted in the timing charts shown in FIG. 2, the frame pulse positions of the area division write addresses W1 and W0 and area division read addresses R1 and R0 differ from each other for each frame by at least one frame. As the result, the order of a time slot is secured when subscriber's data having the capacity of 64[Kbps]×n supplied to the multiplexer of the time switch are switched via the switching device in the switch, and then connected to that of the other subscriber via the backward multiplexer, thereby providing multichannel service.

The area division address generator 20 employed to divide the time memory into four address areas, as shown in FIG. 3, includes a 2-bit counter 21 for sequentially generating successive addresses by counting the reference pulses.

Also, a first flip-flop 22 receives the random read frame pulse signal P2 to delay a signal OUT1 from the 2-bit counter 21 for at least one frame to output the result. In addition, a second flip-flop 23 receives a switching clock C1 to clock a signal OUT2 from the first flip-flop 22 with the signal OUT1 from the 2-bit counter 21, thereby outputting the result.

The process of the operation will be described with reference to timing charts.

Figure 4:
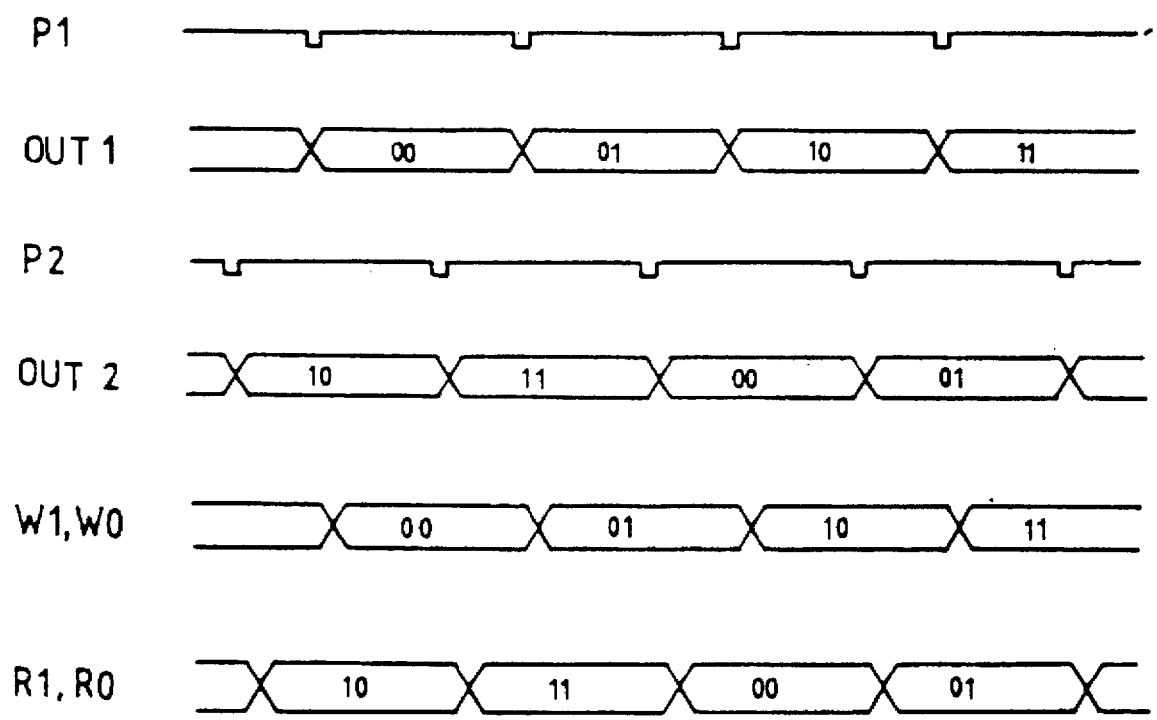
FIG. 4 shows operational timing charts according to the area division address generator.

The 2-bit counter 21 receives and counts the sequential write frame pulses designated as P1 in FIG. 4 to supply the signal OUT1 in the order of 00, 01, 10, 11, 00, 01, 10, . . . , the waveform of which is illustrated as OUT1 in FIG. 4. The output signal OUT1 is partially supplied to the second flip-flop 23 to be synchronized with the switching clock C1 input to the second flip-flop 23, and then output as the area division write addresses W1 and W0. The waveforms of the write addresses W1 and W0 are designated as W1 and W0 in FIG. 4, and are synchronized with the signal from the 2-bit counter 21 but their pulse positions are not changed.

When the output signal OUT1 is partially supplied to the second flip-flop 23, the other output signal OUT1 is partially supplied to the first flip-flop 22 to be delayed for at least one frame by the random read frame pulse signal designated as P2 in FIG. 4, and then supplied to the second flip-flop 23 as the signal OUT2. The input signal OUT2 is synchronized with the switching clock C1 supplied-to the second flip-flop 23 so as to be ultimately output as the area division read addresses R1 and R0. The timing chart of the area division read addresses is designated as R1 and R0 of FIG. 4, which are synchronized with the final output signal OUT2 from the first flip-flop 22 but the pulse positions are not changed.

In the time switching device according to the present invention as described above, only a single time memory having a capacity four times larger than the time switch capacity is utilized to provide the multichannel service. Therefore, as compared with that of conventional arrangements, the time switching device is simply constructed and occupies a small area on a printed circuit board. As a result, a small-sized system is realized and the number of components employed in constructing the system is decreased, thereby reducing system construction cost.

While the present invention has been particularly shown and described with reference to a particular embodiment thereof, it will be understood by those skilled in the art that various changes in form and details may be effected therein without departing from the spirit and scope of the invention as defined by the appended claims.

What is claimed is:

1. A time switching device having identical frame delay used in a full-electronic exchange, comprising:

an area division address generator for maintaining a time difference between memory write time and memory read time by at least one frame period; and a time memory for storing multiplexed data from a multiplexer and for writing the stored multiplexed data in accordance with the time difference being larger than one frame period so as to produce an identical frame delay;

wherein said area division address generator includes a 2-bit counter for counting reference pulses and for generating successive addresses sequentially, a first flip-flop for receiving a random read frame pulse signal and for delaying the successive addresses from said 2-bit counter for at least one frame, and a second flip-flop for receiving a switching clock, for clocking the successive addresses from said 2-bit counter with the delayed successive addresses from the first flip-flop, and for generating write addresses and delayed read addresses with the time difference being larger than one frame period.

2. A time switching method having identical frame delay used in a full-electronic exchange, comprising the steps of:

providing a time memory;

dividing said time memory into four address areas;

establishing a read/write time difference of said time memory larger than one frame period; and accessing said four areas of said time memory sequentially during said write time and said read time;

wherein said dividing step comprises the sub-steps of:

operating a 2-bit counter by means of sequential write frame pulses to produce a signal;

delaying the signal from said 2-bit counter for at least one frame in a first flip-flop by means of a random read frame pulse signal;

generating area division read addresses by means of a switching clock from a second flip-flop;

inputting said signal from said 2-bit counter to said second flip-flop; and clocking said signal by means of said switching clock, thereby producing area division write addresses.

* * * * *